(12) United States Patent
Okamura

(10) Patent No.: US 9,227,216 B2
(45) Date of Patent: Jan. 5, 2016

(54) METHOD AND APPARATUS FOR APPLYING VISCOUS MATERIAL

(71) Applicant: Panasonic Corporation, Osaka (JP)

(72) Inventor: Hiroshi Okamura, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/464,921

(22) Filed: Aug. 21, 2014

(65) Prior Publication Data

US 2015/0079272 A1    Mar. 19, 2015

(30) Foreign Application Priority Data

Sep. 13, 2013   (JP) ................................ 2013-190178

(51) Int. Cl.
| | |
|---|---|
| *B05D 1/00* | (2006.01) |
| *B05D 1/26* | (2006.01) |
| *B05B 12/00* | (2006.01) |
| *B05B 12/08* | (2006.01) |
| *B05C 5/02* | (2006.01) |
| *B05B 13/04* | (2006.01) |

(52) U.S. Cl.
CPC ............ *B05B 12/082* (2013.01); *B05C 5/0212* (2013.01); *B05C 5/0291* (2013.01); *B05B 13/0447* (2013.01)

(58) Field of Classification Search
None
See application file for complete search history.

(56) References Cited

U.S. PATENT DOCUMENTS

2011/0030201 A1    2/2011   Inaba et al.

FOREIGN PATENT DOCUMENTS

| JP | 2011082242 A | * | 4/2011 |
| JP | 4935745 B2 | | 3/2012 |

* cited by examiner

*Primary Examiner* — Lisha Jiang
(74) *Attorney, Agent, or Firm* — Pearne & Gordon LLP

(57) ABSTRACT

An adhering amount detecting process includes: lowering the nozzle to a trial application position; performing a trial application to apply the viscous material to a trial application surface disposed on an application stage; and detecting an amount of the viscous material adhering to the nozzle. Then, whether a difference between maximum and minimum values of the amounts of the viscous material adhering to the nozzle detected by performing the adhering amount detecting process a plurality of times exceeds a threshold is determined. If the difference is determined as not exceeding the threshold, the lowered position of the nozzle with respect to the application target is set such that a gap between the nozzle at the lowered position and an application surface of an application target coincides with a gap between the nozzle at the trial application position and the trial application surface.

2 Claims, 7 Drawing Sheets

METHOD AND APPARATUS FOR APPLYING VISCOUS MATERIAL

BACKGROUND

1. Technical Field

One aspect of the present invention relates to method and apparatus for applying a viscous material to an application target through a nozzle.

2. Background Art

When an electronic component is to be mounted on a circuit board, a viscous material application apparatus is used. In the viscous material application apparatus, a viscous material such as an adhesive is applied to a circuit board serving as an application target while elevating or lowering a nozzle of an application head (for example, see Japanese Patent No. 4935745). In the viscous material application apparatus, a work of setting various application conditions is performed before, for example, the start of an application work in order to attain an adequate application shape in accordance with the kind of a circuit board to be produced, the kind of a component, etc. Conditions to be set include the lowered position of a nozzle during ejection of a viscous material, an ejection amount of the viscous material, etc.

In the work of setting application conditions, under provisionally set application conditions, the viscous material is applied in a trial manner (hereinafter also referred to as "trial-applied") a plurality of times to a sheet which is supplied to an application stage for a trial application, a recognition process is performed on the viscous material on the sheet, and the application state including the shape and the application amount is analyzed. In the case where the analysis result shows that the application is faulty, the setting of the application conditions is changed, and the trial application is again performed. The application conditions under which a satisfactory application state is attained are set as that for a work of application on the circuit board.

SUMMARY

However, there is a case where, even when an application work is performed after application conditions are set by the above-described method, variations occur in application amount of the viscous material which is applied to the circuit board. One of the causes of this is that, when the nozzle is lowered to a predetermined position and the viscous material is applied, the viscous material adheres to the vicinity of the tip end of the nozzle, the amount of the viscous material adhering to the vicinity of the tip end of the nozzle is gradually increased during the process of continuing the application work, and the adhering viscous material drops at a certain timing on the viscous material applied to the board. Even when the viscous material which is trail-applied by the prior art method is analyzed, it is difficult to find specific means for solving this problem. No effective counter measure has been taken against variations in printing amount due to a viscous material adhering to a nozzle.

An object of an aspect of the invention is to provide a viscous material application method and viscous material application apparatus in which variations in application amount due to a viscous material adhering to a nozzle can be suppressed.

According to an aspect of the invention, there is provided a method for applying a viscous material by lowering a nozzle to a lowered position and applying a viscous material ejected from an ejection port formed at a tip end of the nozzle to an application target, the method including: performing an adhering amount detecting process a plurality of times, the adhering amount detecting process including: lowering the nozzle to a trial application position; performing a trial application to apply the viscous material to a trial application surface disposed on an application stage; and detecting an amount of the viscous material adhering to the nozzle, after the trial application is ended and the nozzle begins to elevate from the trial application position; determining whether a difference between maximum and minimum values of the amounts of the viscous material adhering to the nozzle detected the plurality of times exceeds a threshold; and setting, if it is determined that the difference does not exceed the threshold, the lowered position of the nozzle with respect to the application target such that a gap between the nozzle at the lowered position and an application surface of the application target coincides with a gap between the nozzle at the trial application position and the trial application surface.

According to another aspect of the invention, there is provided an apparatus for applying a viscous material by lowering a nozzle to a lowered position and applying a viscous material ejected from an ejection port formed at a tip end of the nozzle to an application target, the apparatus including: an application stage for a trial-application of the viscous material; a adhering amount detecting unit which lowers the nozzle to a trial application position, which performs a trial application to apply the viscous material to a trial application surface disposed on the application stage, and which detects an amount of the viscous material adhering to the nozzle, after the trial application is ended and the nozzle begins to elevate from the trial application position; a adhering amount difference determining unit which determines whether a difference between maximum and minimum values of the amounts of the viscous material adhering to the nozzle detected as a result of performing the trial applications a plurality of times exceeds a threshold; and a nozzle lowered position setting unit which, if the adhering amount difference determining unit determines that the difference does not exceed the threshold, sets the lowered position of the nozzle with respect to the application target such that a gap between the nozzle at the lowered position and the application surface of the application target coincides with a gap between the nozzle at the trial application position and the trial application surface.

According to an aspect of the invention, the adhering amount detecting process is performed a plurality of times. In the adhering amount detecting process, the nozzle is lowered to the trial application position, the trial application to apply the viscous material to the trial application surface disposed on the application stage is performed, and the amount of the viscous material adhering to the nozzle is detected after the trial application is ended and the rising of the nozzle from the trial application position is started. Then, it is determined whether the difference between the maximum and minimum values of the plural detected amounts of the viscous material exceeds the threshold. If it is determined that the difference does not exceed the threshold, the lowered position of the nozzle with respect to the application target is set such that the gap between the nozzle at the lowered position and the application surface of the application target coincides with the gap between the nozzle at the trial application position and the trial application surface. Therefore, it is possible to easily set the lowered position of the nozzle at which variations in application amount due to the viscous material adhering to the nozzle can be effectively suppressed, and a print failure due to the viscous material adhering to the nozzle can be prevented from occurring.

DETAILED DESCRIPTION

Figure 1:
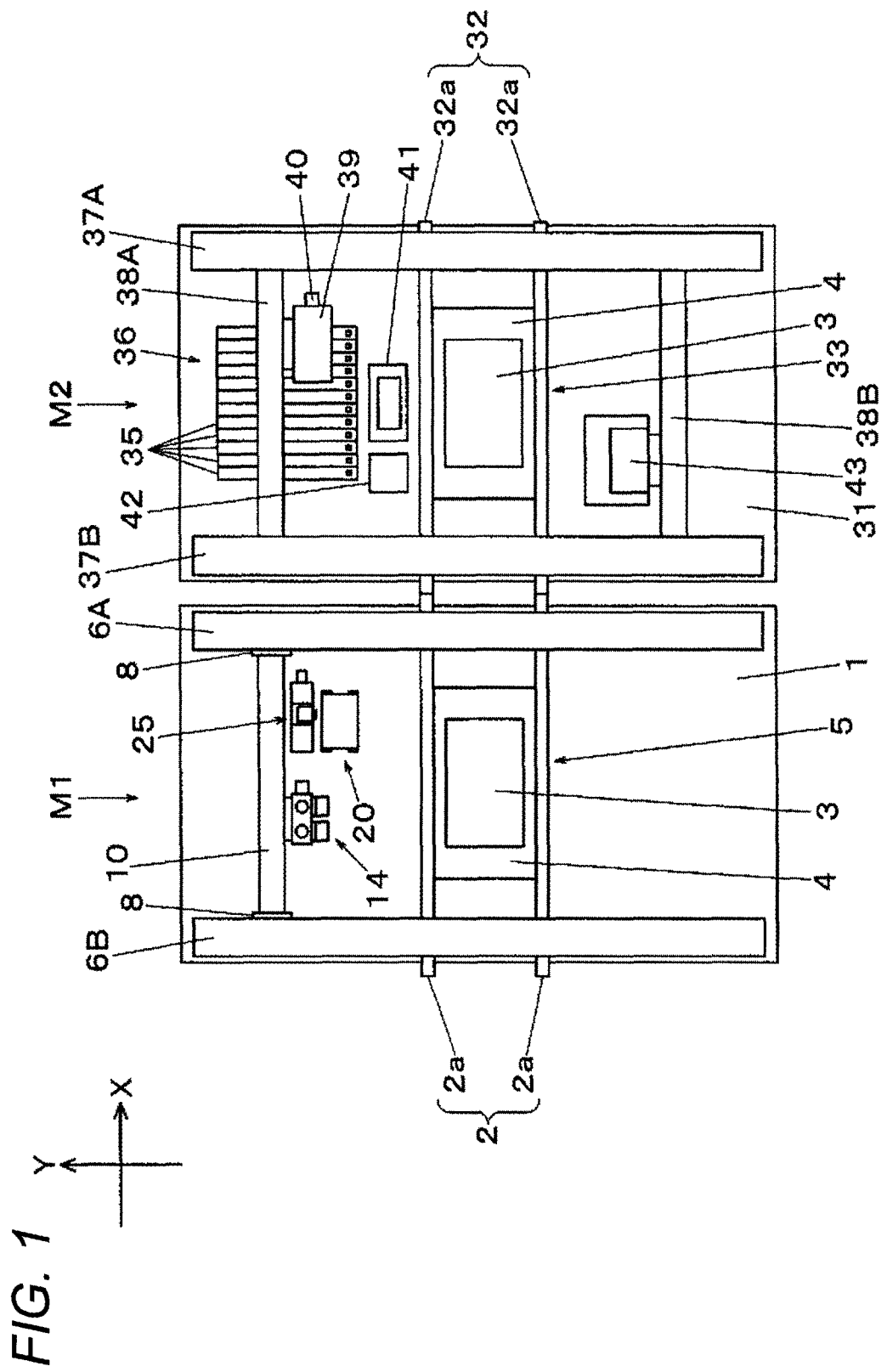
FIG. 1 is a plan view of a viscous material application apparatus of an embodiment of the invention, and a component mounting apparatus.

First, the structures of a viscous material application apparatus and a component mounting apparatus will be described with reference to FIGS. 1, 2, and 3. The viscous material application apparatus and the component mounting apparatus are used respectively as apparatuses which are used for mounting components, and which constitute an electronic component mounting line for mounting electronic components to a circuit board to produce a mounting board. The viscous material application apparatus performs a paste application work of applying paste which is a viscous material such as an adhesive agent for bonding an electronic component, to a circuit board functioning as an application target. The component mounting apparatus is disposed downstream (in the right side of the sheet of FIG. 1) from the viscous material application apparatus, and performs a component mounting work of mounting electronic components to the circuit board to which the paste has been applied.

The viscous material application apparatus M1 will be described. Referring to FIGS. 1 and 2, a board transporting mechanism 2 including a pair of transporting paths 2a which elongate in the X direction that coincides with the board transporting direction is disposed on a platform 1. A board 3 is transported from the upstream side to the downstream side by the board transporting mechanism 2 in a state where the board is held by a carrier 4. A board positioning unit 5 is disposed in a transport route for the board 3. The board 3 is positioned in a predetermined application work position by the board positioning unit 5.

Y-axis moving tables 6A, 6B including a linear driving mechanism are horizontally disposed in both end portions of the X-direction on the platform 1, in the Y-direction which is perpendicular to the X-direction in the horizontal plane. Referring to the FIG. 2, a pair of linear rails 7 extending in the Y-direction are disposed on the Y-axis moving table 6B, and a rectangular coupling bracket 8 is attached to the linear rails 7 through linear blocks 9 so as to be slidable in the Y-direction. On the side of the Y-axis moving table 6A, another coupling bracket 8 is attached in the same configuration.

An X-axis moving table 10 including a linear driving mechanism which is similar to the mechanisms of the Y-axis moving tables 6A, 6B is horizontally hung in the X-direction between the coupling brackets 8 of the Y-axis moving tables. A pair of linear rails 11 extending in the X-direction are disposed on the X-axis moving table 10, and a rectangular Z-axis table 12 is attached to the linear rails 11 through linear blocks 13 so as to be slidable in the X-direction.

A working head 14 including first and second application heads 15A, 15B which are in a vertical attitude is attached to the Z-axis table 12, and first and second nozzles 16A, 16B are attached to lower portions of the first and second application heads 15A, 15B, respectively. When the Y-axis moving tables 6A, 6B and the X-axis moving table 10 are driven, the first and second application heads 15A, 15B are horizontally moved over the board transporting mechanism 2 in the X- and Y-directions. As described above, the Y-axis moving tables 6A, 6B and the X-axis moving table 10 constitute an application head moving mechanism 17 which horizontally moves the first and second application heads 15A, 15B. The first and second application heads 15A, 15B are individually elevated or lowered together with the first and second nozzles 16A, 16B by individually driving first and second motor MA, MB disposed in the Z-axis table 12.

Although the two application heads are provided in the embodiment, one of the heads may be singly disposed. In the following description, only the first application head 15A and the first nozzle 16A will be described, and referred to as simply "application head 15" and "nozzle 16", respectively.

The application head 15 includes a syringe which stores paste P, and an ejecting mechanism 18 (FIG. 3) which ejects the paste P. A preset adequate amount of the paste P is ejected from the nozzle 16 by driving the ejecting mechanism 18, and the nozzle 16 in this state is lowered together with the application head 15 with respect to the board 3, thereby performing a paste application work of applying the paste P to a predetermined position of the upper surface of the board 3. As described above, the upper surface of the board 3 functions as the application surface to which the paste P is to be applied by the application head 15.

Figure 2:
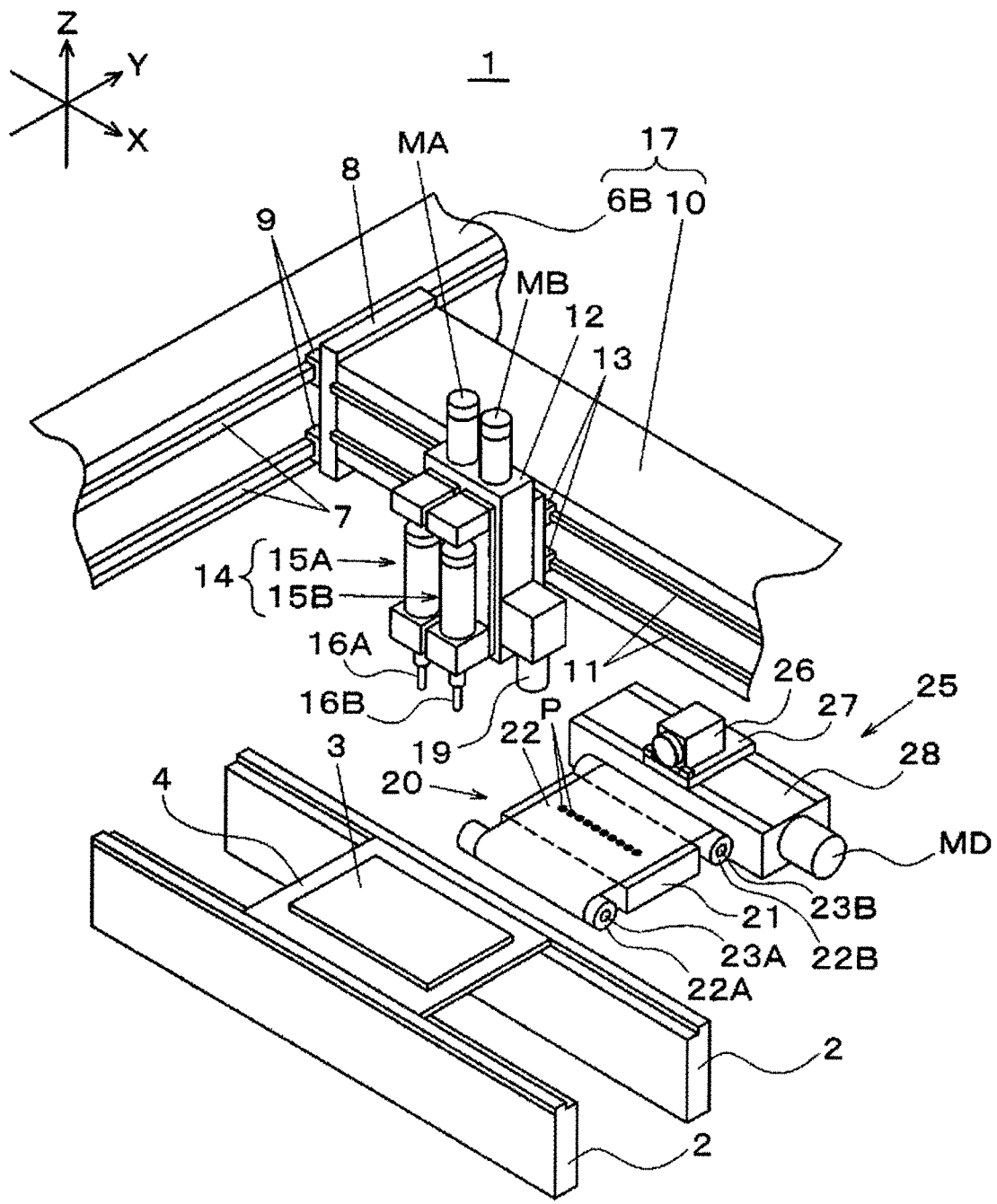
FIG. 2 is a partial perspective view of the viscous material application apparatus of the embodiment of the invention.

Referring to FIG. 2, a board recognition camera 19 in which the imaging field of view is downward directed is disposed on the Z-axis table 12. The board recognition camera 19 is moved integrally with the application head 15, and takes an image of the paste P applied to the board 3.

Referring to FIGS. 1 and 2, a trial application unit 20 is disposed on the platform 1 and within the moving range of the application head 15. The trial application unit 20 is used for trial-applying the paste P in advance of the paste application work. The trial application unit 20 has a configuration where an application stage 21 for trial-applying the paste P is disposed between a supply roll 22A in which a sheet 22 for a trial application is wound, and a take-up roll 22B in which the sheet 22 that has undergone a trial application is wound. The upper surface of the sheet 22 which is supplied onto the application stage 21 is a trial application surface A (FIGS. 5A to 5D) to which the paste P is to be trial-applied by the application head 15.

Figure 3:
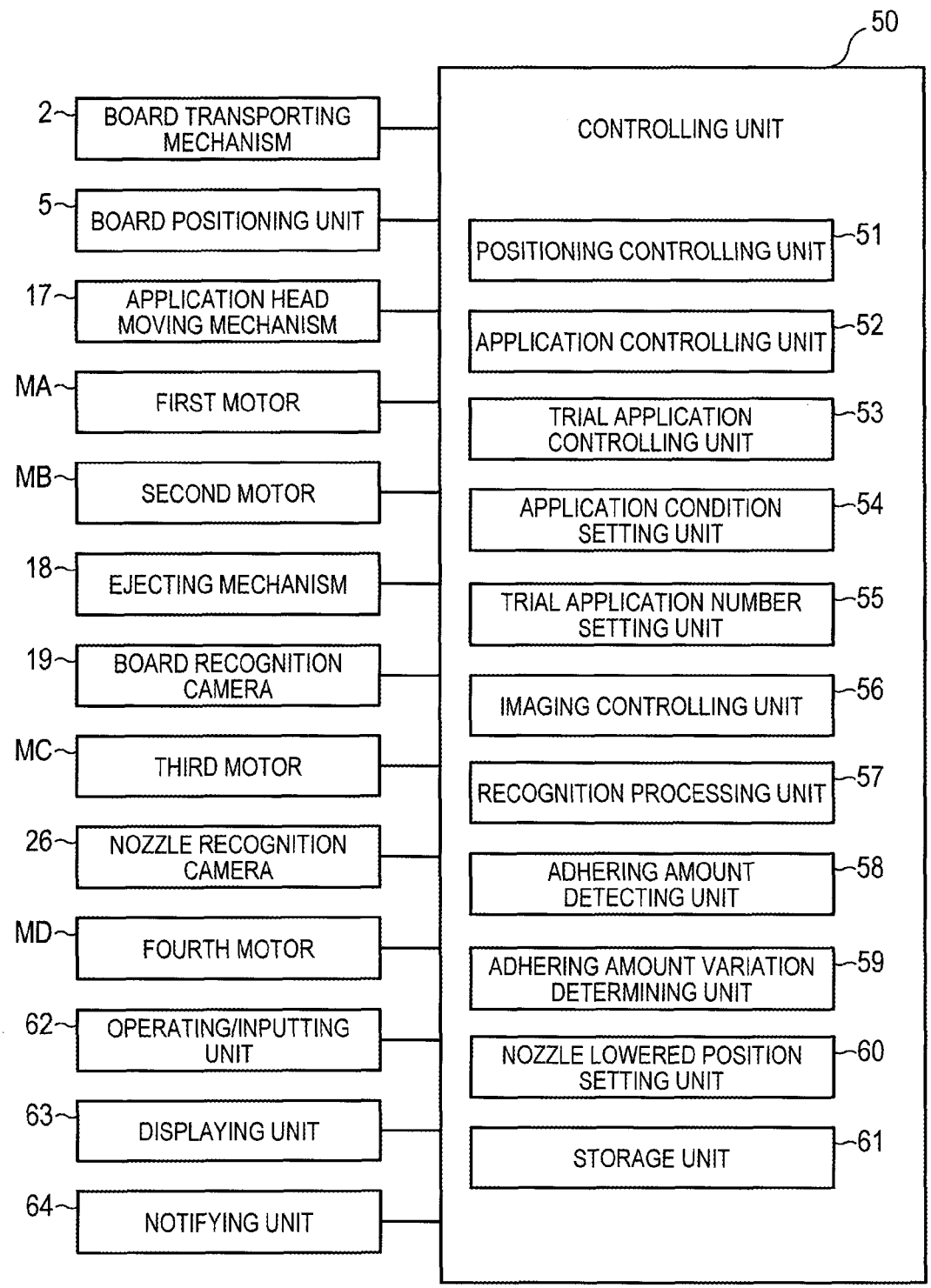
FIG. 3 is a block diagram showing a control system of the viscous material application apparatus of the embodiment of the invention.

The supply roll 22A and the take-up roll 22B are wound around roll support shafts 23A, 23B, respectively, and the roll support shaft 23B is coupled to a third motor MC (FIG. 3). When the third motor MC is driven and the roll support shaft 23B is rotated in the take-up direction, the unused sheet 22 is supplied from the supply roll 22A onto the application stage 21, and the sheet 22 that has undergone a trial application is taken up by the take-up roll 22B. In the embodiment, the height level of the trial application surface A coincides with that of the application surface of the board 3 which is positioned in the application work position.

Referring to FIGS. 1 and 2, a camera unit 25 is disposed in a position which is on the platform 1, and which is adjacent to the trial application unit 20 in the Y-direction. The camera unit 25 has a nozzle recognition camera 26 disposed in an attitude in which the imaging field of view is directed in the horizontal direction along which the trial application surface A is disposed. The unit takes an image of the nozzle 16 after a trial application is performed. The nozzle recognition camera 26 is attached movably in the X-direction to a linear movement mechanism 28 which extends in the X-direction, through a movement plate 27. When a fourth motor MD of the linear movement mechanism 28 is driven, the nozzle recognition camera 26 is moved in the X-direction.

Next, the component mounting apparatus M2 will be described with reference to FIG. 1. A board transporting mechanism 32 including a pair of transporting paths 32a which extend in the X-direction is disposed on a platform 31. The board 3 to which the paste P has been applied in the viscous material application apparatus M1 is transferred from the transporting paths 2a to the transporting paths 32a, in a state where the board is held by the carrier 4. A board positioning unit 33 is disposed in a transport route for the board 3. The board 3 is positioned in a predetermined component mounting work position by the board positioning unit 33.

A component supplying unit 36 in which a plurality of tape feeders 35 are juxtaposed in the X-direction is disposed in one side portion in the Y-direction of the platform 31. Each of the tape feeders 35 pitch-feeds a carrier tape which holds electronic components, to supply the electronic components to a pickup position where a mounting head 39 that will be described later is disposed.

Y-axis moving tables 37A, 37B including a linear movement mechanism are horizontally disposed in the Y-direction in both end portions of the X-direction on the platform 31, respectively. X-axis moving tables 38A, 38B which similarly include a linear driving mechanism are hung between the Y-axis moving tables 37A, 37B so as to be slidable in the Y-direction.

The mounting head 39 is attached to the X-axis moving table 38A so as to be movable in the X-direction. When the Y-axis moving tables 37A, 37B and the X-axis moving table 38A are driven, the mounting head 39 is moved in the X- and Y-directions. A suction nozzle which is to suck and hold an electronic component is attached to a lower end portion of the mounting head 39. A board recognition camera 40 in which the imaging field of view is downward directed is attached to the mounting head 39 to take an image of the board 3 which is positioned in the component mounting work position. In a component mounting work, the mounting head 39 is moved to the pickup position, picks up an electronic component, and then mounts the component onto the board 3 which is positioned in the component mounting work position.

A component recognition camera 41 in which the imaging field of view is upward directed is disposed on the moving path for the mounting head 39. The component recognition camera 41 takes an image of the electronic component held by the suction nozzle of the mounting head 39, from the lower side. When a recognition process is performed on the image data which are obtained from the component recognition camera 41, the pass/fail of the electronic component is determined, and the position of the electronic component is detected. A disposal box 42 is disposed in a position adjacent to the component recognition camera 41. An electronic component which is determined to be failed is discarded into the disposal box 42.

An inspection head 43 including an inspection camera in which the imaging field of view is downward directed is attached to the X-axis moving table 38B so as to be movable in the X-direction. When the Y-axis moving tables 37A, 37B and the X-axis moving table 38B are driven, the inspection head 43 is moved in the X- and Y-directions. The inspection camera takes an image of the electronic components mounted on the board 3. When a recognition process is performed on the image data which are obtained from the inspection camera, the pass/fail of the mounted state of each electronic component is determined.

Next, the control system of the viscous material application apparatus M1 will be described with reference to FIG. 3. A controlling unit 50 provided in the viscous material application apparatus M1 includes a positioning controlling unit 51, an application controlling unit 52, a trial application controlling unit 53, an application condition setting unit 54, a trial application number setting unit 55, an imaging controlling unit 56, a recognition processing unit 57, an adhering amount detecting unit 58, an adhering amount variation determining unit 59, a nozzle lowered position setting unit 60, and a storage unit 61. The board transporting mechanism 2, the board positioning unit 5, the application head moving mechanism 17, the first motor MA, the second motor MB, the ejecting mechanism 18, the board recognition camera 19, the third motor MC, the nozzle recognition camera 26, the fourth motor MD, an operating/inputting unit 62, a displaying unit 63, and a notifying unit 64 are connected to the controlling unit 50.

The positioning controlling unit 51 controls the board transporting mechanism 2 and the board positioning unit 5, thereby transporting the board 3 through the carrier 4 to the application work position and positioning the board in the position. The application controlling unit 52 controls the application head moving mechanism 17, the first motor MA, the second motor MB, and the ejecting mechanism 18 to perform the paste application work of applying the paste P to the board 3 positioned in the application work position.

The trial application controlling unit 53 controls the application head moving mechanism 17, the first motor MA, the second motor MB, and the ejecting mechanism 18, thereby performing a trial application of the paste P on the sheet 22 supplied onto the application stage 21. The trial application is performed on a not-yet-applied position on the sheet 22 to which the paste P is not applied. The sheet 22 is supplied or taken up by controlling the third motor MC.

The application condition setting unit 54 sets various application conditions imposed in the application of the paste P to the board 3 or the sheet 22. The application conditions include the ejection amount of the paste P, the elevating/lowering speed of the nozzle 16, and the elevated/lowered position of the nozzle. Hereinafter, the lowered position (lowered level) of the nozzle 16 during the trial application is referred to as "trial application position". The trial application number setting unit 55 sets the number of times at which the trial application is successively performed.

The imaging controlling unit 56 controls the board recognition camera 19 to take an image of the board 3 positioned in the application work position. The unit controls also the nozzle recognition camera 26 to take an image of the nozzle 16 at a predetermined timing after the trial application is performed and the elevating operation is started, more specifically a tip end portion which is the vicinity of an ejection port 16a shown in FIG. 5D.

The recognition processing unit 57 performs a recognition process on the image data of the board 3 to recognize the position of the board 3. The recognition processing unit 57 further performs a recognition process (binarization process) on the image data of the nozzle 16 to separately recognize the nozzle 16 after performing the trial application and paste adhering to the nozzle (hereinafter, such paste is referred to as "paste portion Pa" (see FIG. 5D)).

Based on the result of the recognition of the paste portion Pa, the adhering amount detecting unit 58 detects (calculates) the amount of the paste portion Pa adhering to the nozzle 16. Namely, the adhering amount detecting unit 58 functions as a viscous-material adhering amount detecting unit for lowering the nozzle 16 to the trial application position, trial-applying the paste P to the trail application surface A disposed on the application stage 21, and detecting the amount of the paste portion Pa which adheres to the nozzle 16 after the trial application is ended and the nozzle begins to elevate from the trial application position.

The adhering amount variation determining unit 59 determines whether, in the case where the trial application is performed successively a plurality of times, the increasing/decreasing width, i.e., the variation width of the paste portion Pa is within a predetermined threshold range or not, based on adhering amounts of the paste portion Pa which are detected after the respective ends of the trial applications by the adhering amount detecting unit 58. Namely, the adhering amount variation determining unit 59 functions as a viscous material adhering amount difference determining unit for determining whether the difference between the maximum and minimum values of the amounts of the paste portion Pa adhering to the nozzle 16 which are detected as a result of performing a plurality of times a trial application exceeds a predetermined threshold or not.

If it is determined that the variation width of the paste portion Pa does not exceed the threshold, the nozzle lowered position setting unit 60 sets the trial application position of the nozzle 16 which is set at the timing, as the lowered position which is to be used in the paste application work. In the embodiment, the height level of the application surface of the board 3 coincides with that of the trial application surface A, and therefore the value of the lowering distance which is input in the setting of the application conditions can be set as it is. By contrast, in the case where the trial applications are performed under a situation where the height level of the application surface of the board 3 is not equal to that of the trial application surface A, the value of the lowering distance of the nozzle 16 is calculated and set so that the gap between the lower end of the nozzle 16 and the board 3 coincides with that between the lower end of the nozzle 16 which is lowered to the trial application position, and the trial application surface A.

Namely, the nozzle lowered position setting unit 60 functions as a nozzle lowered position setting unit for, if the viscous material adhering amount difference determining unit determines that the difference does not exceed the threshold, setting the lowered position of the nozzle 16 with respect to the board 3 so that the gap between the lower end of the nozzle 16, and the application surface of the board 3 at the timing when the nozzle 16 is lowered to a predetermined position with respect to the board 3 coincides with that between the lower end of the nozzle 16, and the trial application surface at the timing when the nozzle 16 is lowered to the trial application position.

The storage unit 61 stores programs for performing the paste application work and trial applications, various preset application conditions, and the number of trial applications. The storage unit 61 further stores the above-described threshold which is used in the adhering amount variation determining unit 59.

The operating/inputting unit 62 is an inputting unit such as a touch panel or a mouse. For example, operation instructions for operating the apparatus, the application conditions, and the number of trial applications are input and set through the operating/inputting unit 62. The displaying unit 63 is a display panel such as a liquid crystal panel, and, for example, displays a setting screen for allowing the operator to set the application conditions and the number of trial applications. In the case where the variation width of the paste portion Pa exceeds the threshold, the notifying unit 64 notifies the operator of this fact through the displaying unit 63.

Figure 4:
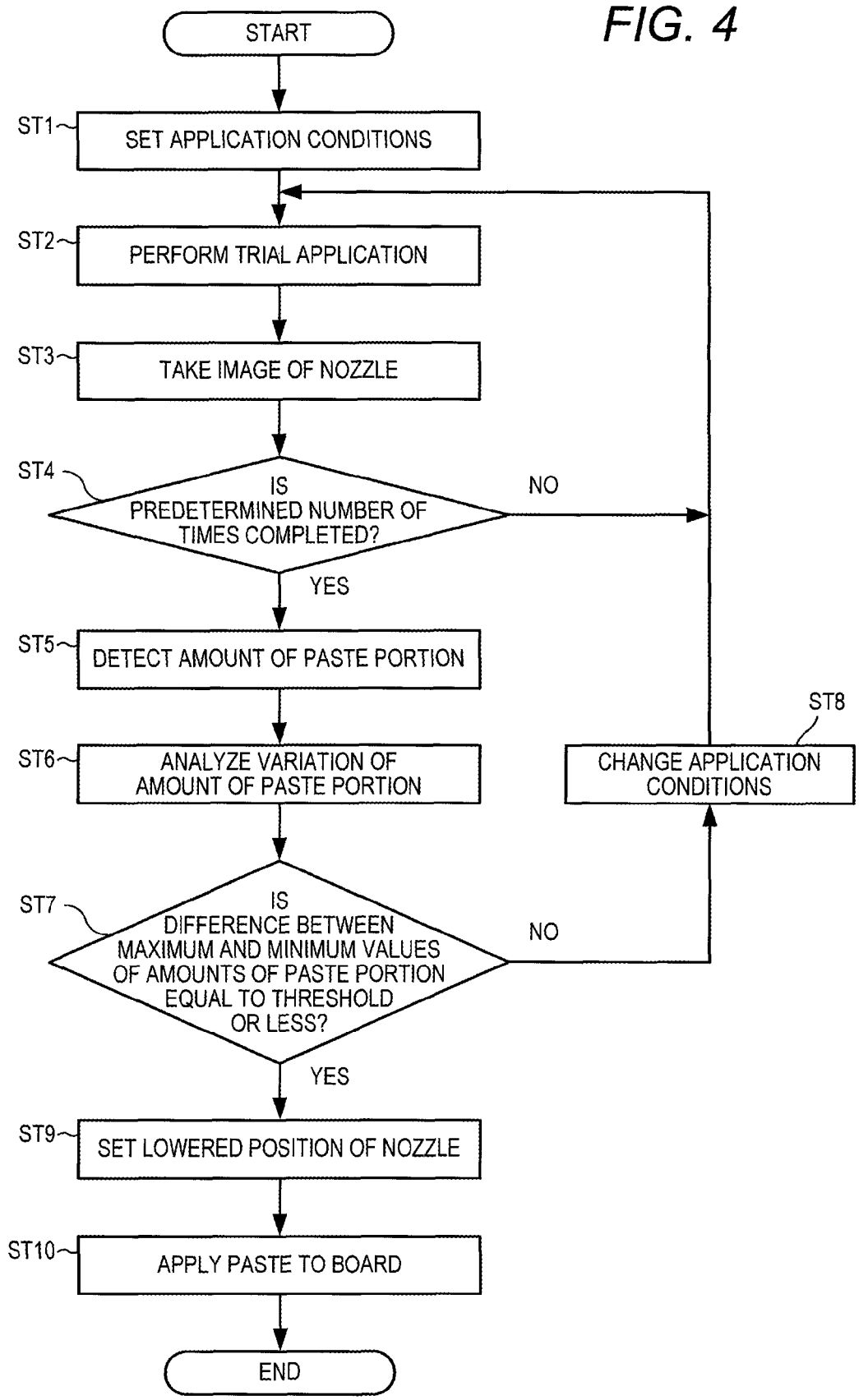
FIG. 4 is a flowchart showing the operation of the viscous material application apparatus of the embodiment of the invention.

The viscous material application apparatus M1 of the invention is configured as described above. Next, the operation of applying the paste P including the setting of the lowered position of the nozzle 16 which is used in the paste application work will be described with reference to FIG. 4. In the example which is described below, it is assumed that all application conditions except the lowered position of the nozzle 16 are fixed.

Figure 5A:
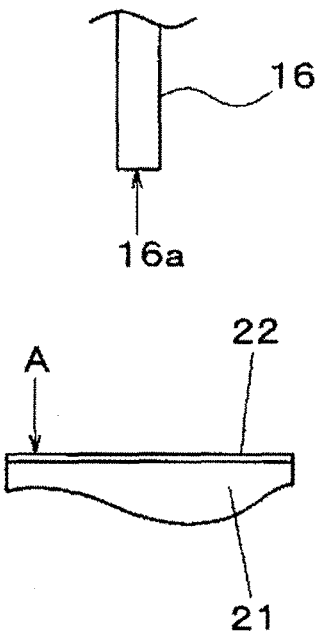
FIGS. 5A to 5D are diagrams illustrating the operation of the viscous material application apparatus of the embodiment of the invention.
Figure 5B:
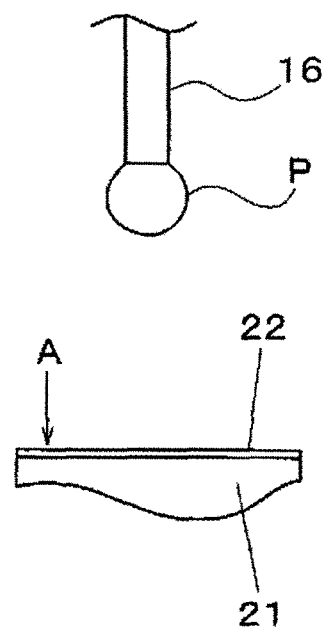
Figure 5C:
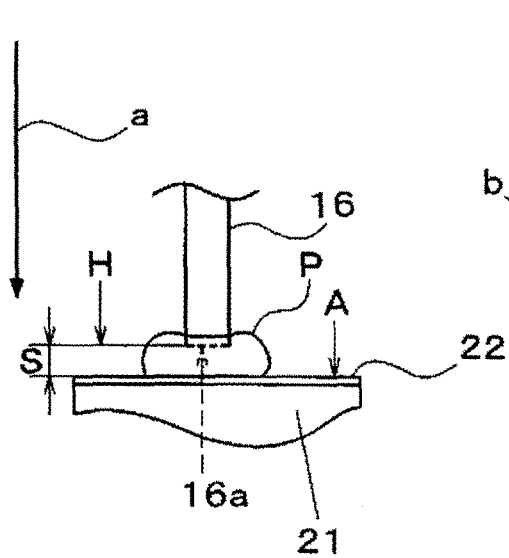

First, various application conditions including the trial application position of the nozzle 16 are set (ST1: an application condition setting step). Here, also the number of trial applications is set. In this example, the number is "six". Next, the trial application of the paste P is performed in accordance with the set application conditions (ST2: a trial application step). As shown in FIGS. 5A and 5B, namely, the nozzle 16 is positioned above the application stage 21, and then a predetermined amount of the paste P is ejected from the ejection port 16a. The nozzle 16 is lowered to a trial application position H shown in FIG. 5C (the arrow a), and the paste P is pressingly applied to the trial application surface A of the sheet 22 supplied onto the application stage 21. At this time, the shorter the distance S from the ejection port 16a to the sheet 22, the easier a part of the paste P adheres to the vicinity of the tip end of the nozzle 16.

Figure 5D:
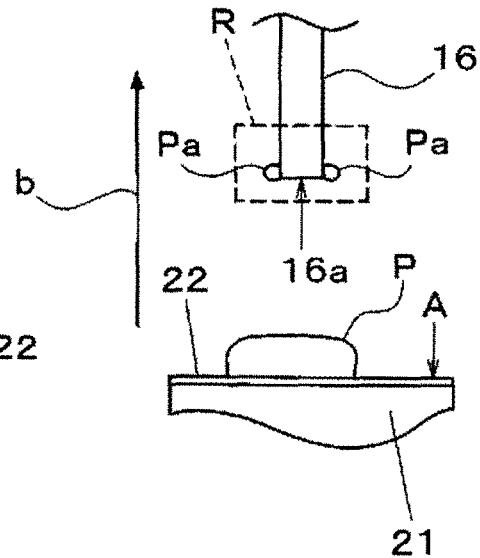

Next, an image of the nozzle 16 after the trial application is taken (ST3: a nozzle imaging step). As shown in FIG. 5D, namely, an image of the vicinity of the tip end of the nozzle 16 is taken by the nozzle recognition camera 26 at a predetermined timing after the trial application is ended and the nozzle begins to elevate (the arrow b). The range R indicated by the broken line in FIG. 5D shows the imaging field of view of the nozzle recognition camera 26. The imaging timing is set to a timing that is after the nozzle 16 is elevated to a level at which the paste P that is trial-applied to the sheet 22, and the paste portion Pa adhering to the nozzle 16 can be clearly distinguished from each other.

Next, it is determined whether the number of the trial applications reaches the predetermined number or not (ST4: a trial application number determining step). If it is determined that the number is smaller than the predetermined one, the process returns to ST2 to again perform the trial application based on the same trial application position H. In the case where trial applications are successively performed in this way, the later application is performed while avoiding the position(s) of the sheet 22 to which the paste P has been applied. After the previous trial application is completed and the nozzle 16 is elevated, namely, the application head 15 is moved in the X-direction by a predetermined distance to position the nozzle 16 above a not-yet-applied position of the sheet 22. After the nozzle 16 is positioned in this way, the second and subsequent trial applications are performed (see the paste P which is trial-applied to the sheet 22 shown in FIG. 2). As described above, a trial application is performed on a not-yet-applied position of the sheet 22.

Moreover, also the nozzle recognition camera 26 is moved in the X-direction by the predetermined distance by following the movement of the application head 15. Then, an image of the vicinity of the tip end of the nozzle 16 in which a second or subsequent trial application is ended, and which is elevated to the imaging field of view (the range R) of the nozzle recognition camera 26 is taken.

If it is determined in ST4 that the predetermined number of the trial applications have been completed, the amount of the paste portion Pa which adheres to the vicinity of the tip end of the nozzle 16 after each trial application is detected based on the plurality sets of obtained image data of the nozzle 16 (ST5: a paste amount detecting step). As a result, it is possible to obtain paste adhering amount data (FIG. 6) which show the transition of the amount of the paste portion Pa that adheres to the nozzle 16 after each trial application. The data point Tn (n=1 to 6) shown in FIG. 6 indicates the amount of the paste portion Pa which adheres to the nozzle 16 after the trial application is performed n times (n=1 to 6).

ST2 to ST5 which are described above constitute a viscous-material adhering amount detecting step of performing a plurality of times the process of lowering the nozzle 16 to the trial application position H, trial-applying the paste P to the trial application surface A disposed on the application stage 21, and detecting the amount of the paste P (paste portion Pa) which adheres to the nozzle 16 after the trial application is ended and the nozzle begins to elevate from the trial application position H.

Then, the variation of the amounts of the paste portion Pa which adhere to the vicinity of the nozzle 16 after the respective trial applications is analyzed based on the paste adhering amount data (ST6: a variation analyzing step). The variation of the adhering amounts of the paste portion Pa will be described with reference to FIG. 6. As described above, when the nozzle 16 is lowered to the trial application position H, the shorter the distance S from the ejection port 16a to the sheet 22, the easier a part of the paste P adheres to the vicinity of the tip end of the nozzle 16 in a trial application. In such a case, the nozzle 16 is elevated from the trial application position H to the predetermined position while the paste portion Pa remains to adhere to the nozzle (FIG. 5D).

When trial applications are successively performed in this state, the paste P which is newly ejected from the ejection port 16a adheres to the paste portion Pa that has adhered to the nozzle 16, and the adhering amount of the paste portion Pa is further increased. When a trial application is repeatedly performed a plurality of times under such a situation, the amount of the paste portion Pa adhering to the nozzle 16 is gradually increased. When the amount of the paste portion Pa adhering to the nozzle 16 then reaches a certain value, a situation where the paste portion is caused to drop from the nozzle 16 by its own weight may occur. Namely, it is possible to assume that the paste portion Pa drops from the nozzle 16 at a timing when the adhering amount of the paste portion Pa becomes smaller than that which is detected in the immediate previous detection.

Figure 6:
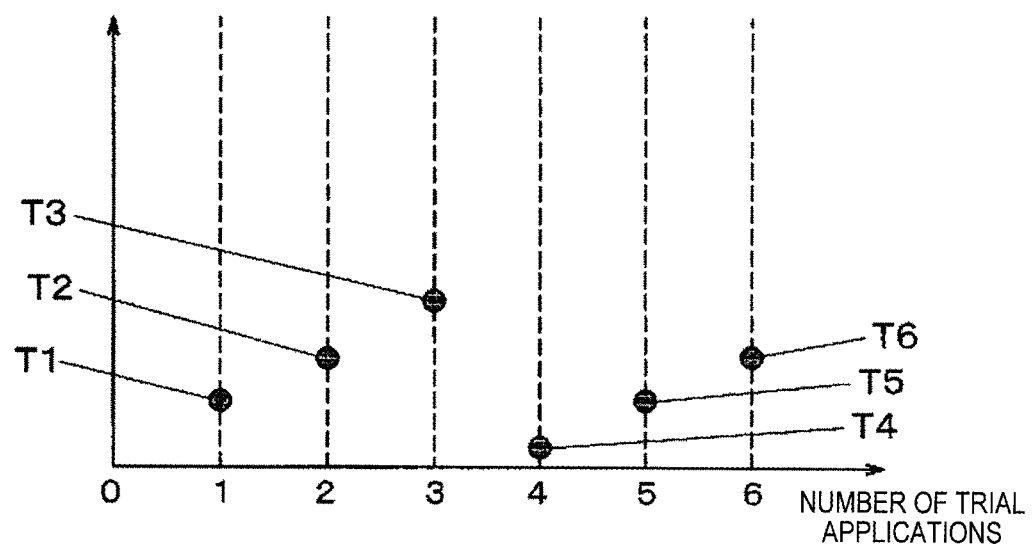
FIG. 6 is a view showing paste adhering amount data in the embodiment of the invention.

An analysis of the paste adhering amount data indicated in FIG. 6 shows that the adhering amount (data point T3) of the paste portion Pa which is detected after the third trial application is largest, and the adhering amount (data point T4) of the paste portion Pa which is detected after the fourth trial application is smallest. Therefore, it is assumed that the paste portion Pa drops from the nozzle 16 during the time period from the imaging of the nozzle 16 which is performed after the end of the third trial application, to that of the nozzle 16 which is performed after the end of the forth trial application.

After the variation of the adhering amount of the paste portion Pa is analyzed, it is determined whether the variation width is equal to or less than the threshold or not. Namely, it is determined whether the difference between the maximum and minimum values of the amounts of the paste portion Pa adhering to the nozzle 16 which are detected as a result of execution of a plurality of trial applications is equal to or less than the predetermined threshold or not (ST7: an adhering amount difference determining step). If the difference is equal to or less than the predetermined threshold, it is determined that the paste portion Pa has not dropped, and, if the difference exceeds the threshold, it is determined that the paste portion Pa has dropped. The threshold is arbitrarily set based on the knowledge and experience of the operator.

As described above, the variation width of the adhering amount of the paste portion Pa occurring between timings before and after the drop of the paste portion Pa from the nozzle 16 is maximum. In ST7, therefore, it is determined whether the paste portion Pa drops or not, based on the difference of adhering amounts of the paste portion Pa which are detected in the detections (n-th and (n+1)-th) that are before and after a trial application. Alternatively, it may be determined whether the paste portion drops or not, based on, for example, the slope of a line segment connecting data points Tn, Tn+1 detected in the detections that are before and after a trial application. Alternatively, a timing when the adhering amount of the paste portion Pa becomes smaller than that which is detected in the immediate previous detection may be identified as the timing when the paste portion Pa drops, and the determination may be performed by comparing the increasing/decreasing width of the adhering amount of the paste portion Pa at this timing with a threshold.

If it is determined in ST7 that the variation width of the adhering amount of the paste portion Pa exceeds the threshold, the setting of the application conditions is changed (ST8: an application condition changing step). Namely, the trial application controlling unit 53 sets a position which is higher by a predetermined distance than the trial application position H that is currently set, as a new trial application position Ha. Then, the adhering amount detecting step, the variation analyzing step, and the adhering amount difference determining step are performed based on the new trial application position.

By contrast, if it is determined that the variation width does not exceed the threshold, the trial application position H which is set at the timing is set as the lowered position of the nozzle 16 which is applied to the paste application work that is to be performed on the board 3 (ST9: a nozzle lowered position setting step). In this step, also the other application conditions which are set at the timing are set as the application conditions which are applied to the paste application work.

Namely, if it is determined that the difference between the maximum and minimum values of the adhering amounts of the paste portion Pa does not exceed the threshold, the lowered position of the nozzle 16 with respect to the board 3 is set so that the gap between the lower end of the nozzle 16 and the application surface of the board 3 at the timing when the nozzle 16 is lowered to the predetermined position coincides with that between the lower end of the nozzle 16 and the trial application surface A at the timing when the nozzle 16 is lowered to the trial application position H. Therefore, it is possible to easily set the lowered position of the nozzle 16 at which accumulation of the paste portion Pa to the nozzle 16 can be suppressed.

Then, the paste application work is performed on the board 3 based on various application conditions including the set lowered position of the nozzle 16 (ST10: a paste applying step). The paste application work is successively performed a plurality of times the number of which is equal to or larger than that of the trial applications. However, the lowered position of the nozzle 16 is set to the level at which accumulation of the paste portion Pa to the nozzle 16 can be suppressed. Therefore, it is possible to suppress a situation where variations in application amount of the paste P which is to be applied to the board 3 are produced by a phenomenon in which the paste portion Pa adhering to the nozzle 16 drops onto the board 3.

Figure 7:
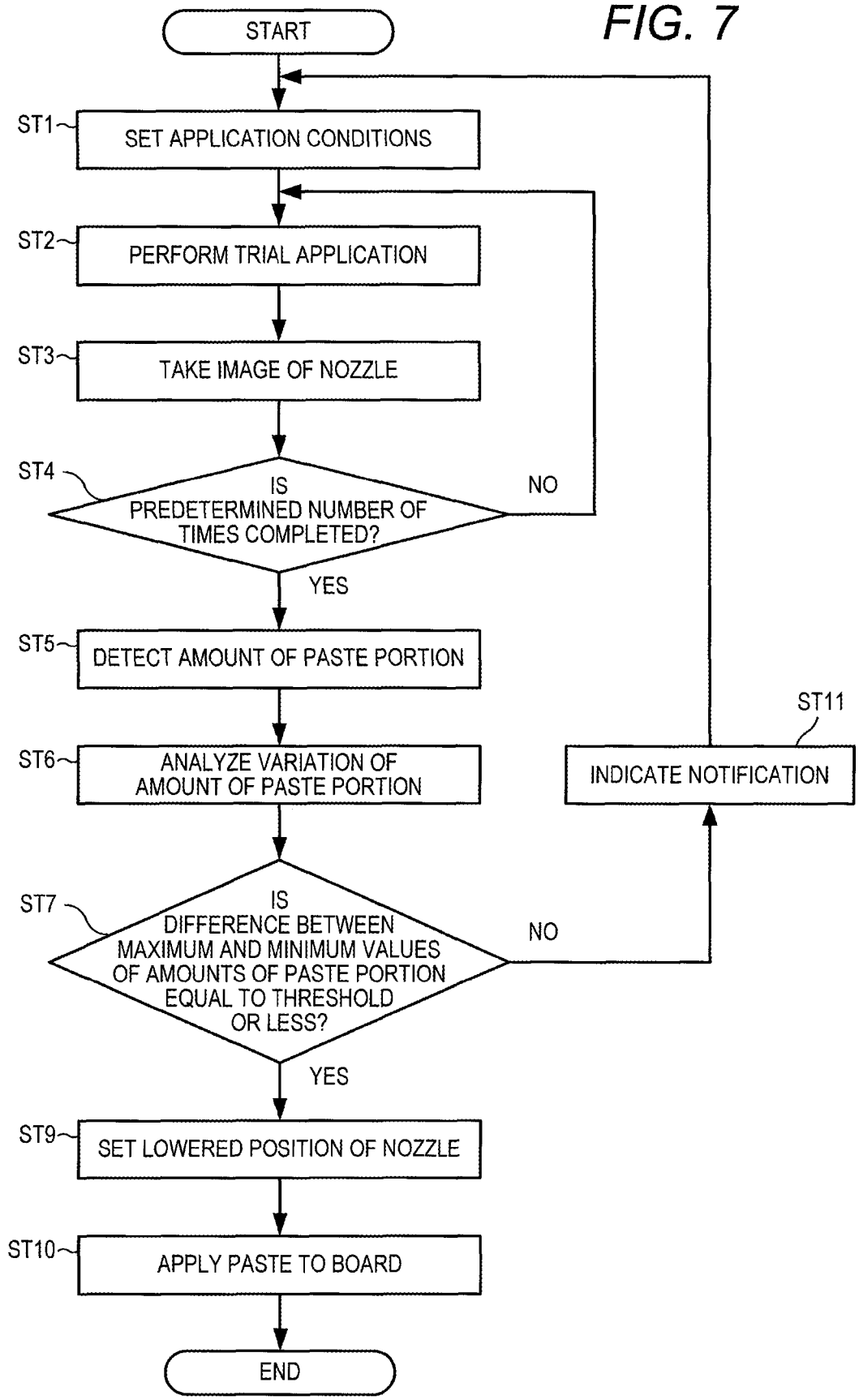
FIG. 7 is a flowchart showing the operation of a viscous material application apparatus of another embodiment of the invention.

Next, another embodiment will be described with reference to FIG. 7. In the above-described embodiment, the setting of the application conditions is changed by the trial application controlling unit 53. In this embodiment, the operator changes the setting. If it is determined in ST7 that the variation width of the adhering amount of the paste portion Pa exceeds the threshold, namely, this situation is notified to the operator through the displaying unit 63 (ST11: a notifying step). Upon receiving the notification, the operator causes the process to return to ST1, and again sets a position which is higher by a predetermined distance than the trial application position H that has been set, through the operating/inputting unit 62 as a new trial application position Ha. As a result, the new trial application position Ha can be arbitrarily set at the discretion of the operator.

The invention is not limited to the embodiments described above. For example, an electronic-component mounting mechanism including the above-described mounting head 39, an inspecting mechanism which checks the state of the paste P applied to the board 3, and the like may be incorporated into the viscous material application apparatus M1. The sheet 22 may not be disposed, and the upper surface of the application stage 21 may be used as a trial application surface.

According to the invention, a print failure due to a viscous material adhering to a nozzle can be prevented from occurring. Therefore, the invention is useful in the field in which electronic components are mounted onto a wiring board.

What is claimed is:

1. A method for applying a viscous material by lowering a nozzle to a lowered position and applying a viscous material ejected from an ejection port formed at a tip end of the nozzle to an application target, said method comprising:

performing an adhering amount detecting process a plurality of times, the adhering amount detecting process comprising:

lowering the nozzle to a trial application position;

performing a trial application to apply the viscous material to a trial application surface disposed on an application stage; and detecting an amount of the viscous material adhering to the nozzle, after the trial application is ended and the nozzle begins to elevate from the trial application position;

determining whether a difference between maximum and minimum values of the amounts of the viscous material adhering to the nozzle detected the plurality of times exceeds a threshold; and setting, if it is determined that the difference does not exceed the threshold, the lowered position of the nozzle with respect to the application target such that a gap between the nozzle at the lowered position and an application surface of the application target coincides with a gap between the nozzle at the trial application position and the trial application surface.

2. The viscous material application method according to claim 1, further comprising:

setting, if it is determined that the difference exceeds the threshold, a position higher by a given distance than the trial application position as a new trial application position; and performing the adhering amount detecting process a plurality of times using the new trial application position, and determining whether the difference exceeds the threshold.

* * * * *